US005719406A

United States Patent [19]

Cisneros et al.

[11] Patent Number: 5,719,406

[45] Date of Patent: Feb. 17, 1998

[54] FIELD EMISSION DEVICE HAVING A CHARGE BLEED-OFF BARRIER

[75] Inventors: Ralph Cisneros; John Song, both of Tempe, Ariz.

[73] Assignee: Motorola, Inc., Schaumburg, Ill.

[21] Appl. No.: 727,686

[22] Filed: Oct. 8, 1996

[51] Int. Cl.[6] .............................. H01L 29/06; H01L 29/12

[52] U.S. Cl. .............................. 257/10; 313/336; 438/20

[58] Field of Search .............................. 257/10, 11; 313/309, 313/310, 336, 351; 438/20

[56] References Cited

U.S. PATENT DOCUMENTS 5,126,287 6/1992 Jones .............................. 437/228
5,188,977 2/1993 Stengl et al. .............................. 437/89
5,442,193 8/1995 Jaskie et al. .............................. 257/10
5,668,437 9/1997 Chadha et al. .............................. 313/495

*Primary Examiner*—Sara W. Crane
*Attorney, Agent, or Firm*—Eugene A. Parsons

[57] ABSTRACT

An improved field emission device (200, 800) includes a supporting substrate (210, 810), a conductive layer (215, 815) formed on the supporting substrate (210,810), a dielectric layer (240, 840) formed on the conductive layer (215, 815) and defining an emitter well (260, 860), a charge bleed-off barrier (290, 890)provided on the lateral surfaces (245, 845) of the emitter well, an electron emitter (270, 870) located within the emitter well (260, 860), a gate extraction electrode (250, 850) formed on the dielectric layer (240, 840) and spaced from the electron emitter (270, 870), and an anode (280, 880) spaced from the gate extraction electrode (250, 850).

14 Claims, 4 Drawing Sheets

200

-PRIOR ART-

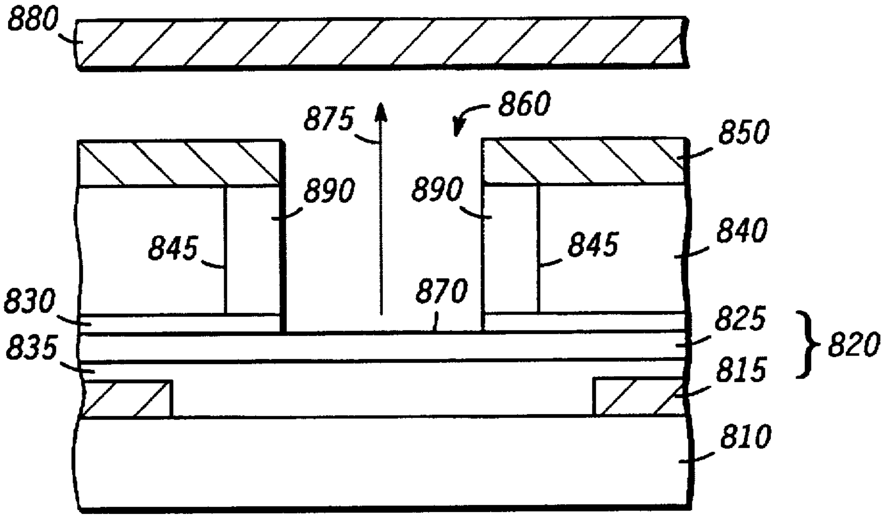
800
FIG. 8
FIG. 9
900
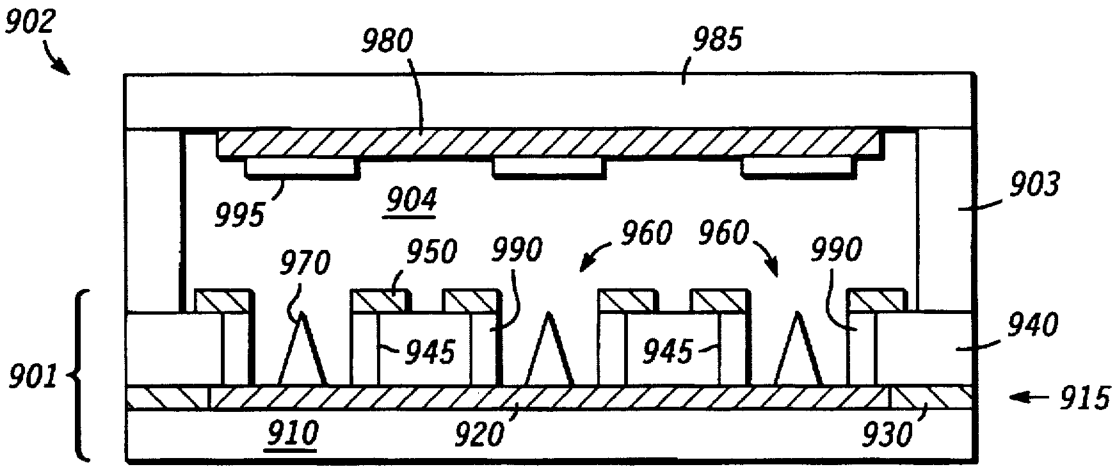

FIELD EMISSION DEVICE HAVING A CHARGE BLEED-OFF BARRIER

FIELD OF THE INVENTION

The present invention pertains to field emission devices and more specifically to triode field emission devices.

BACKGROUND OF THE INVENTION

Field emission devices are known in the art. In one configuration, the field emission device, a diode, includes two electrodes: a cathode and an anode; in another common configuration the field emission device, a triode, includes three electrodes: a cathode, a gate electrode, and an anode. Illustrated in FIG. 1 is a prior art field emission device (FED) 100 having a triode configuration. FED 100 includes a gate extraction electrode 150 which is spaced from a conductive layer 115 by a dielectric layer 140. Dielectric layer 140 precludes the formation of electrical currents between gate extraction electrode 150 and conductive layer 115. Spaced from gate electrode 150 is an anode 180, which is made from a conductive material. Dielectric layer 140 has lateral surfaces 145 which define an emitter well 160. An electron emitter 170 is disposed within emitter well 160 and may include a Spindt tip. In this particular configuration, conductive layer 115, which is formed on a supporting substrate 110, includes a conductive portion 130 and a ballast resistor portion 120, which is in ohmic contact with conductive portion 130. Ballast resistor portion 120 has a greater resistance than conductive portion 130 in order to minimize arcing between electron emitter 170 and gate extraction electrode 150. During the operation of FED 100, and as is typical of triode operation in general, suitable voltages are applied to gate extraction electrode 150, conductive layer 115, and anode 180 for extracting electrons from electron emitter 170 and causing them to be directed toward anode 180 (as indicated by an arrow 175 in FIG. 1). When used in a field emission display, anode 180 has deposited thereon a cathodoluminescent material 195, and the electrons impinge upon cathodoluminescent material 195, which is thereby caused to emit light. However, the impingement of electrons upon cathodoluminescent material 195 also causes gaseous ions and contaminants to emanate therefrom. These gaseous ions and contaminants thereafter impinge upon gate extraction electrode 150 and perhaps upon electron emitters 170, thereby causing additional ions and/or particles to be emitted therefrom. These particles and charged species deposit upon lateral surfaces 145 of dielectric layer 140, thereby forming a charged surface within emitter well 160. There is no conduction path over which this accumulated electrical charge can be bled off. The charged surface exhibits the undesirable effect of altering the nature of the predetermined electric field within emitter well 160, and, over a period of operation, leads to the ultimate breakdown of the device.

Thus, there exists a need for an improved field emission device useful in field emission displays which does not fail from the accumulation of electrical charge at the lateral surfaces of the dielectric layer.

BRIEF DESCRIPTION OF THE DRAWINGS

Referring to the drawings:

FIG. 8 is a cross-sectional view of another embodiment of an improved field emission device in accordance with the present invention; and FIG. 9 is a cross-sectional view of an embodiment of a field emission display including the improved field emission device of FIG. 2, in accordance with the present invention.

DESCRIPTION OF THE PREFERRED EMBODIMENT

Figure 1:
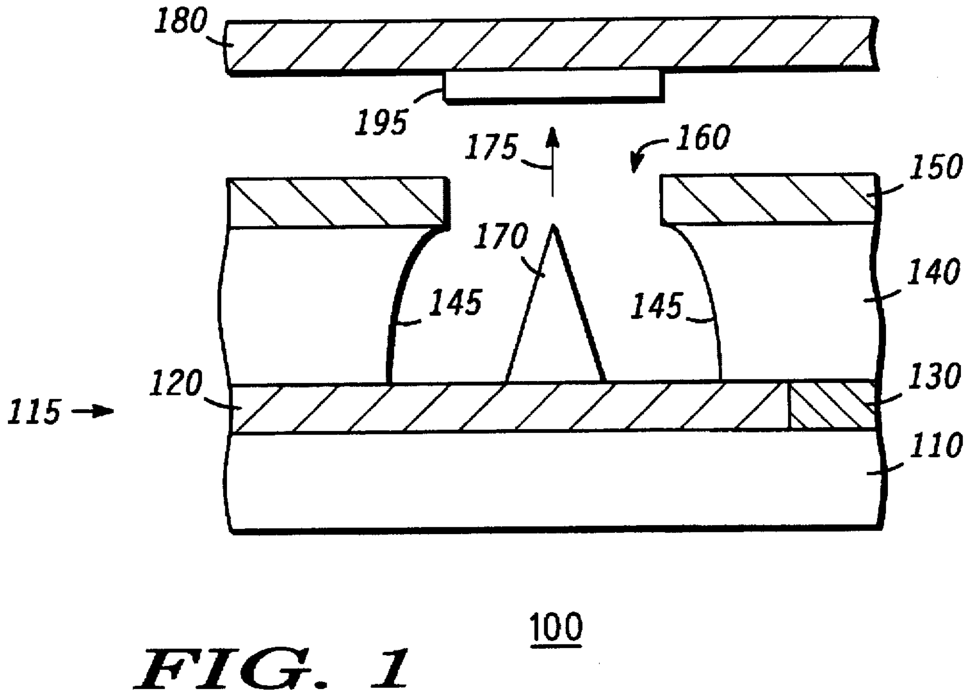
FIG. 1 is a cross-sectional view of a prior art field emission device.
Figure 2:
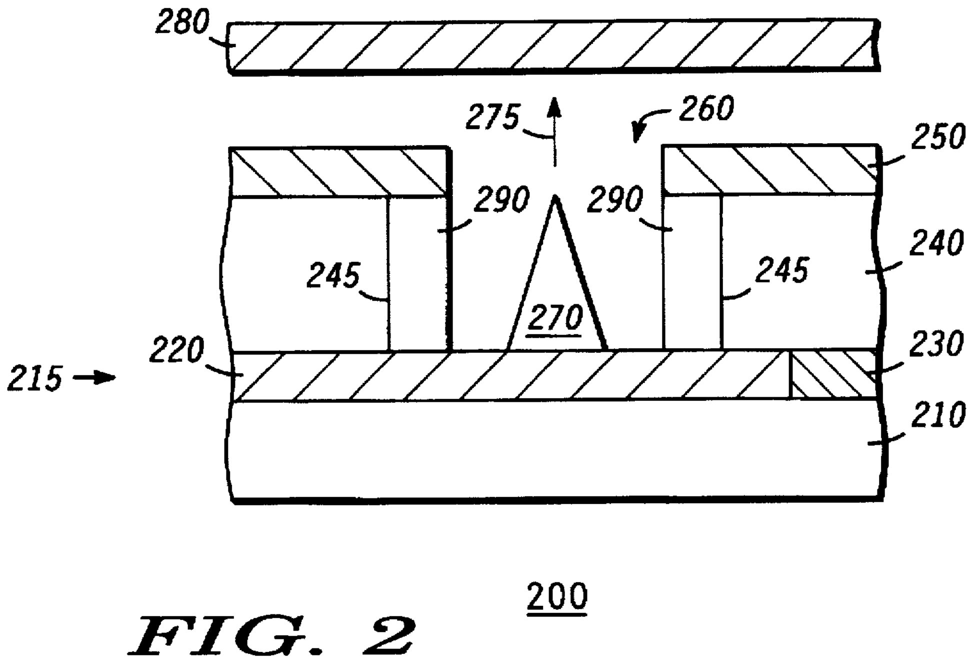
FIG. 2 is a cross-sectional view of an embodiment of an improved field emission device in accordance with the present invention.
Figure 3:
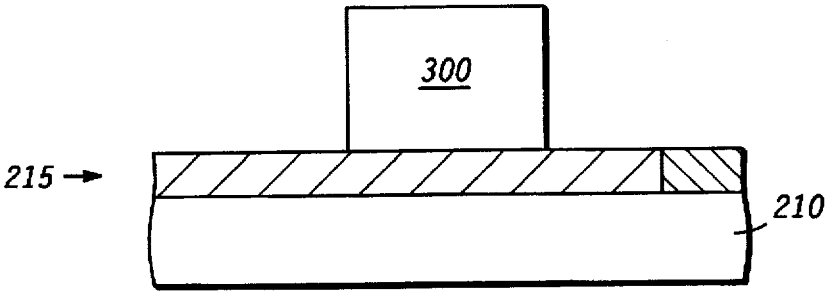
FIGS. 3–7 are cross-sectional views of structures realized by performing various steps of a method for fabricating the improved field emission device of FIG. 2, in accordance with the present invention.

Referring now to FIG. 2, there is depicted a cross-sectional view of an improved field emission device (FED) 200 in accordance with the present invention. FED 200 includes a supporting substrate 210, which may be made from glass, such as borosilicate glass, or silicon. Upon supporting substrate 210, is formed a conductive layer 215. In this particular embodiment, conductive layer 215 includes a ballast resistor portion 220, which may be made from amorphous silicon, and a conductive portion 230, which is made from a conductive material, such as aluminum or molybdenum. A dielectric layer 240 is formed on conductive layer 215. Dielectric layer 240 has lateral surfaces 245 which define an emitter well 260. In accordance with the present invention, a charge bleed-off barrier 290 is formed on lateral surfaces 245 and extends into a portion of emitter well 260. The electrical resistance provided by charge bleed-off barrier 290, including the resistivity of the material comprising charge bleed-off barrier 290, are predetermined to effect the conduction of charged species which impinge upon charge bleed-off barrier 290, thereby preventing the accumulation of surface charge during the operation of FED 200. The value of a suitable bleed-off current will depend upon the application within which FED 200 is employed. Suitable materials for charge bleed-off barrier 290 include, but are not limited to, semiconductive materials, such as amorphous silicon, and conductive ceramics. In general, the resistance of charge bleed-off barrier 290 is adequate to conduct/bleed-off the impinging charges and high enough to prevent disturbance of the electric field within emitter well 260. An electron emitter 270 is disposed within the remaining portion of emitter well 260, on ballast resistor portion 220 of conductive layer 215. A gate extraction electrode 250 is deposited on dielectric layer 240 and is spaced from electron emitter 270. Ballast resistor portion 220 precludes destructive arcing between electron emitter 270 and gate extraction electrode 250. An anode 280 is spaced from gate extraction electrode 250. The operation of FED 200 includes applying the appropriate potentials to conductive layer 215, gate extraction electrode 250, and anode 280 to produce electron emission from electron emitter 270, which, in this particular embodiment, includes the emission of electrons from the tip of the Spindt tip, and to guide the emitted electrons (as indicated by an arrow 275 in FIG. 2) toward anode 280 at an appropriate acceleration. Charge bleed-off barrier 290 precludes the impingement of gaseous charged species onto lateral surfaces 245 of dielectric layer 240, thereby preventing the formation of a charged dielectric surface which would otherwise distort the electric field.

Figure 4:
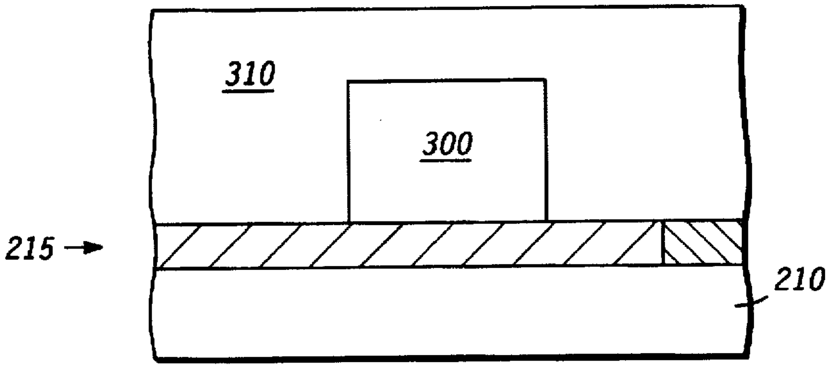
Figure 5:
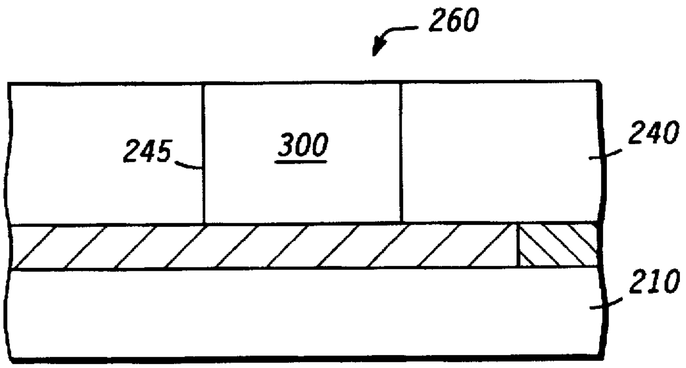
Figure 6:
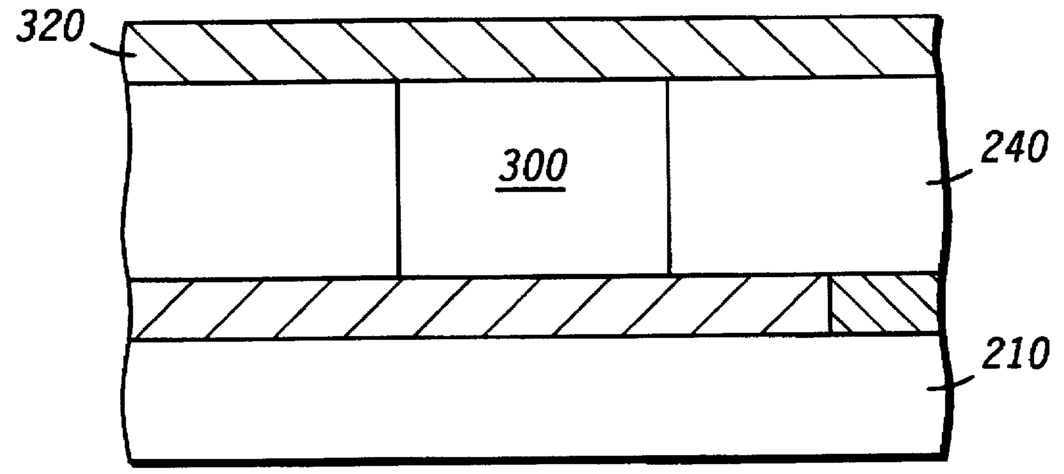
Figure 7:
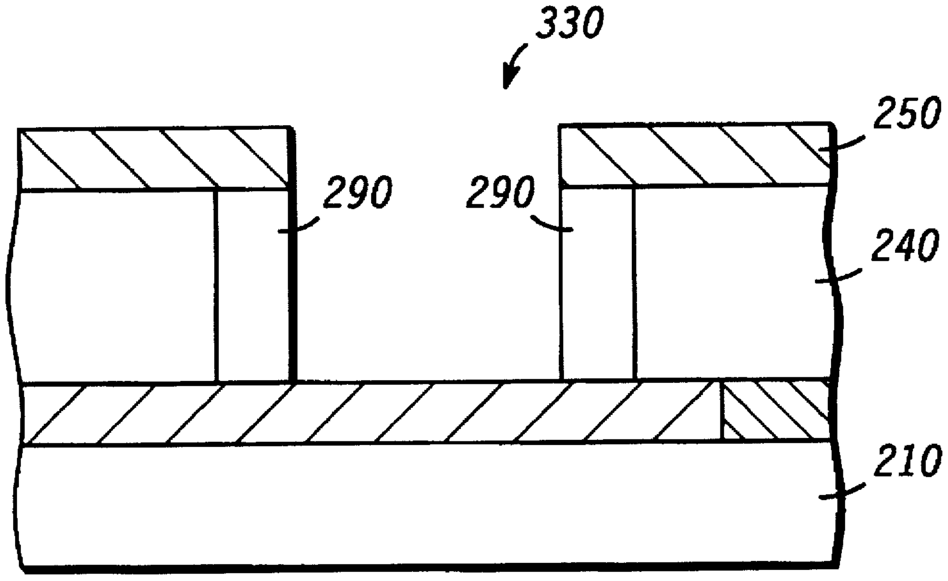

Many methods for fabricating FED 200 will occur to one skilled in the art. Standard deposition and patterning techniques may be employed. Referring now to FIGS. 3–7, there are depicted structures realized by various steps of one such method for fabricating FED 200 (FIG. 2), in accordance with the present invention. First, conductive layer 215 is patterned onto supporting substrate 210. Then, a charge bleed-off layer 300 is deposited and patterned onto conductive layer 215, thereby providing the structure depicted in FIG. 3. Thereafter, as illustrated in FIG. 4, a dielectric material 310, which may include spin-on glass (SOG) or silicon dioxide, is deposited onto charge bleed-off layer 300 and onto the exposed surfaces of conductive layer 215. Then, as illustrated in FIG. 5, an upper portion of dielectric material 310 is removed, as by etching or polishing, so that none of the dielectric material remains on the upper surface of charge bleed-off layer 300, thereby forming dielectric layer 240, having lateral surfaces 245 which define emitter well 260. Thereafter, a layer 320 of a suitable gate extraction metal, such as molybdenum, is deposited on dielectric layer 240 and charge bleed-off layer 300. Thereafter, a well 330 is selectively etched into layer 320 and charge bleed-off layer 300, thereby realizing charge bleed-off barrier 290 and gate extraction electrode 250. Thereafter, electron emitter 270 is formed within well 330, and, in this particular embodiment, includes the evaporation of a cone-shaped, Spindt tip field emitter.

Referring now to FIG. 8, there is depicted a cross-sectional view of an improved field emission device (FED) 800, in accordance with the present invention. FED 800 includes a supporting substrate 810, which may be made from glass, such as borosilicate glass, or silicon. Upon supporting substrate 810, is formed a conductive layer 815, which is made from a suitable conductive material, such as aluminum or molybdenum. An emissive structure 820 is formed on conductive layer 815. Emissive structure 820 includes three layers: a first ballast layer 835, which is deposited upon conductive layer 815 and includes a resistive material such as amorphous silicon; an electron emissive layer 825, which is formed on first ballast layer 835 and includes a field emissive film made from a suitable electron emissive material such as, for example, diamond-like carbon, cubic boron nitride, or aluminum nitride; and a second ballast layer 830, which is disposed upon a portion of electron emissive layer 825 and is made from a resistive material such as amorphous silicon. A dielectric layer 840 is formed on second ballast layer 830 and includes lateral surfaces 845 which define an emitter well 860. Dielectric layer 840 is made from a suitable dielectric material, such as SOG or silicon dioxide. Electron emissive layer 825 includes an emissive surface disposed within emitter well 860 and defining electron emitter 870. In accordance with the present invention, a charge bleed-off barrier 890 is formed on lateral surfaces 845, within a portion of emitter well 860; electron emitter 870 is disposed within the remaining portion of emitter well 860. The electrical resistance provided by charge bleed-off barrier 890, including the resistivity of the material comprising charge bleed-off barrier 890, are predetermined to effect the conduction of charged species which impinge upon charge bleed-off barrier 290, thereby preventing the accumulation of surface charge. The value of a suitable bleed-off current will depend upon the application within which FED 800 is employed. Suitable materials for charge bleed-off barrier 890 include, but are not limited to, conductive ceramics and semiconductive materials, such as amorphous silicon. In general, the resistance of charge bleed-off barrier 890 is adequate to conduct/bleed-off the impinging charges and high enough to prevent distortion of the electric field. A gate extraction electrode 850 is deposited on dielectric layer 840 and is spaced from electron emitter 870. An anode 880 is spaced from gate extraction electrode 850. The operation of FED 800 includes applying the appropriate potentials to conductive layer 815, gate extraction electrode 850, and anode 880 to produce electron emission from electron emitter 870, which, in this particular embodiment, includes the emission of electrons from the surface of an emissive film, and to guide the emitted electrons (as indicated by an arrow 875 in FIG. 8) toward anode 880 at an appropriate acceleration. Charge bleed-off barrier 890 precludes the impingement of gaseous ions onto lateral surfaces 845 of dielectric layer 840, thereby preventing the formation of a charged dielectric surface which would otherwise distort the electric field within emitter well 860. Second ballast layer 830 aids in shaping the electric field in the region of electron emitter 870. FED 800 may be fabricated in a manner similar to that described with reference to FIGS. 3–7 for the fabrication of FED 200 (FIG. 2). After the deposition of conductive layer 815, first ballast layer 835 and electron emissive layer 825 are deposited thereon. Then, a layer of ballast material is formed. Upon the layer of ballast material is patterned a charge bleed-off layer. Thereafter, a dielectric material is deposited onto the charge bleed-off layer and onto the exposed surfaces of the layer of ballast material. Then, an upper portion of the dielectric material is removed, as by etching or polishing, so that none of the dielectric material remains on the upper surface of the charge bleed-off layer, thereby forming dielectric layer 840, having lateral surfaces 845 which define emitter well 860. Thereafter, a layer of suitable gate extraction metal is deposited on dielectric layer 840 and the charge bleed-off layer. Thereafter, a well is selectively etched into the layer of gate metal, the charge bleed-off layer, and the layer of ballast material, thereby realizing gate extraction electrode 850, charge bleed-off barrier 890, and second ballast layer 830 and also thereby defining electron emitter 870.

Referring now to FIG. 9, there is depicted a cross-sectional view of a field emission display 900, in accordance with the present invention, and including FED 200 of FIG. 2. Field emission display 900 includes a cathode plate 901, which includes: a supporting substrate 910, which may be made from glass or silicon; a patterned conductive layer 915, which is formed on supporting substrate 910; a dielectric layer 940, which is disposed on patterned conductive layer 915; and a plurality of emitter wells 960 defined by a plurality of lateral surfaces 945 of dielectric layer 940. Each of the plurality of emitter wells 960 includes therein a charge bleed-off barrier 990, which is formed on lateral surfaces 945 of each well 960 and extends into a portion of well 960; in the remaining portion of well 960 is disposed an electron emitter 970. In this particular embodiment, electron emitter 970 includes a Spindt tip. A gate extraction electrode 950 is formed on dielectric layer 940 and patterned so that electron emitters 970 may be individually addressed. Each charge bleed-off barrier 990 has a resistance suitable to maintain the low RC time constant necessary for the device and to, simultaneously, provide adequate conductivity to bleed off impinging electrical charges, thereby preventing the accumulation of surface charge. The resistance is also high enough to prevent disturbance of the electric field. The value of a suitable bleed-off current will depend upon variables such as the overall size of field emission display 900. Suitable materials for charge bleed-off barrier 990 include, but are not limited to, semiconductive materials, such as amorphous silicon, and conductive ceramics. In this particular embodiment, patterned conductive layer 915 includes a ballast portion 920 having an predetermined resistivity and a conductive portion 930. Ballast portion 920 may be made from amorphous silicon, and conductive portion 930 is made from a conductive material, such as aluminum or molybdenum. The ballasting provided by ballast portion 920 prevents electrical arcing between gate extraction electrode 950 and electron emitter 970. An anode plate 902 is provided and opposes cathode plate 901. Anode plate 902 includes a transparent supporting substrate 985, which can be made from glass. A transparent conductive layer 980, which is made from, for example, indium tin oxide (ITO), is deposited on transparent supporting substrate 985. A cathodoluminescent material 995 is deposited on transparent conductive layer 980 and configured to receive electrons emitted by electron emitters 970. A frame 903 is disposed between cathode plate 901 and anode plate 902 at their peripheries to provide standoff therebetween and define an interspace region 904. Interspace region 904 is evacuated to a pressure of about $1\times10^{-6}$ Torr. In the operation of field emission display 900, electron emitters 970 are selectively addressed by providing predetermined voltages at patterned conductive layer 915 and gate extraction electrode 950. The emitted electrons are accelerated toward anode plate 902 by providing a predetermined potential at transparent conductive layer 980. The electrons are received by cathodoluminescent material 995, which is thereby caused to emit light. The light then travels through transparent conductive layer 980 and transparent supporting substrate 985. The impingement of electrons upon cathodoluminescent material 995 also causes impurities and gaseous charged species to be emitted therefrom. Some of these gaseous species will travel through interspace region 904 and impinge upon gate extraction electrode 950 and electron emitters 970, thereby forming additional charged gaseous species which impinge upon charge bleed-off barriers 990. This charge is conducted away by charge bleed-off barriers 990 toward patterned conductive layer 915 and/or gate extraction electrode 950, thereby preventing the accumulation of surface charge and concomitant breakdown of the display.

While we have shown and described specific embodiments of the present invention, further modifications and improvements will occur to those skilled in the art. We desire it to be understood, therefore, that this invention is not limited to the particular forms shown, and we intend in the appended claims to cover all modifications that do not depart from the spirit and scope of this invention.

We claim:

1. An improved field emission device comprising:
   - a supporting substrate having a major surface;
   - a conductive layer disposed on the major surface of the supporting substrate;
   - a dielectric layer having a major surface and being disposed on the conductive layer and defining lateral surfaces, the conductive layer and the lateral surfaces of the dielectric layer defining an emitter well;
   - a charge bleed-off barrier being disposed within a portion of the emitter well and being coextensive with the lateral surfaces of the emitter well, the charge bleed-off barrier having a resistance suitable to conduct electrical charges impinging thereon;
   - an electron emitter being disposed within the emitter well and being in ohmic contact with the conductive layer;
   - a gate extraction electrode being disposed on the major surface of the dielectric layer and being spaced from the electron emitter; and
   - an anode being distally disposed with respect to the gate extraction electrode.

2. An improved field emission device as claimed in claim 1 wherein the charge bleed-off barrier is made from a conductive ceramic.

3. An improved field emission device as claimed in claim 1 wherein the charge bleed-off barrier is made from a semiconductive material.

4. An improved field emission device as claimed in claim 3 wherein the semiconductive material includes amorphous silicon.

5. An improved field emission device as claimed in claim 1 wherein the dielectric layer is made from spin-on glass.

6. An improved field emission device as claimed in claim 1 wherein the electron emitter includes a Spindt tip.

7. An improved field emission device as claimed in claim 1 wherein the electron emitter includes a field emissive film.

8. An improved field emission device as claimed in claim 1 further including a cathodoluminescent layer disposed on the anode and designed to receive electrons emitted from the electron emitter.

9. A method for fabricating an improved field emission device including the steps of:
   - providing a supporting substrate;
   - forming a conductive layer on the supporting substrate;
   - forming a dielectric layer on the conductive layer, the dielectric layer having lateral surfaces defining an emitter well;
   - forming on the lateral surfaces of the dielectric layer, and within a portion of the emitter well, a charge bleed-off barrier thereby defining a remaining portion of the emitter well, the charge bleed-off barrier having a resistance suitable to conduct electrical charges impinging thereon during the operation of the improved field emission device;
   - forming within the remaining portion of the emitter well an electron emitter;
   - forming a gate extraction electrode on the dielectric layer and spaced from the electron emitter; and
   - providing an anode spaced from the gate extraction electrode.

10. A method for fabricating an improved field emission device as claimed in claim 9 wherein the step of forming a dielectric layer includes depositing a layer of spin-on glass.

11. An improved field emission display comprising:
   - a cathode plate including
     - a supporting substrate having a major surface;
     - a patterned conductive layer disposed on the major surface of the supporting substrate;
     - a dielectric layer having a major surface and being disposed on the conductive layer, the dielectric layer having a plurality of lateral surfaces defining a plurality of emitter wells;
     - a gate extraction electrode being disposed on the major surface of the dielectric layer;
     - within each of the plurality of emitter wells, a charge bleed-off barrier being disposed within a portion of the emitter well and being coextensive with the lateral surfaces of the dielectric layer, the charge bleed-off barrier having a resistance suitable to conduct electrical charges impinging thereon during the operation of the improved field emission display;
     - a plurality of electron emitters being disposed one each within the plurality of emitter wells and being in ohmic contact with the patterned conductive layer, the gate extraction electrode being spaced from each of the plurality of electron emitters;
   - an anode plate including
     - a transparent supporting substrate having a major surface and being distally disposed with respect to the gate extraction electrode of the cathode plate;

a transparent conductive layer disposed on the major surface of the transparent supporting substrate of the anode plate;

a cathodoluminescent material disposed on the transparent conductive layer and designed to receive electrons emitted by the plurality of electron emitters; and a frame being disposed between the cathode plate and the anode plate to provide standoff therebetween, the frame, the anode plate, and the cathode plate defining an interspace region.

12. An improved field emission display as claimed in claim 11 wherein the charge bleed-off barrier is made from a semiconductive material.

13. An improved field emission display as claimed in claim 12 wherein the semiconductive material includes amorphous silicon.

14. An improved field emission display as claimed in claim 11 wherein the charge bleed-off barrier is made from a conductive ceramic.

* * * * *